US010011749B2

(12) United States Patent
Das et al.

(10) Patent No.: US 10,011,749 B2
(45) Date of Patent: *Jul. 3, 2018

(54) RE-WORKABLE MOISTURE CURABLE HOT MELT ADHESIVE COMPOSITION, METHODS OF USING THE SAME, AND ARTICLES INCLUDING THE SAME

(71) Applicant: H.B. Fuller Company, St. Paul, MN (US)

(72) Inventors: Sudipto Das, St. Paul, MN (US); Henry P. Meyer, Stillwater, MN (US); Anthony J. Ostlund, Centerville, MN (US)

(73) Assignee: H.B. Fuller Company, St. Paul, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/826,547

(22) Filed: Aug. 14, 2015

(65) Prior Publication Data
US 2016/0046845 A1 Feb. 18, 2016

Related U.S. Application Data

(60) Provisional application No. 62/049,489, filed on Sep. 12, 2014, provisional application No. 62/037,817, filed on Aug. 15, 2014.

(51) Int. Cl.
*C09J 175/06* (2006.01)
*H05K 5/00* (2006.01)
(Continued)

(52) U.S. Cl.
CPC ............ *C09J 175/06* (2013.01); *B32B 38/10* (2013.01); *B32B 43/006* (2013.01); *C08G 18/12* (2013.01);
(Continued)

(58) Field of Classification Search
CPC ........ C09J 175/04; C09J 175/06; C08G 18/12; C08G 18/4277; C08G 18/4238;
(Continued)

(56) References Cited

U.S. PATENT DOCUMENTS 5,776,406 A * 7/1998 Schubert ............ B29C 45/0001
264/328.1
6,221,978 B1 4/2001 Li
(Continued)

FOREIGN PATENT DOCUMENTS

CN 103289631 A 9/2013
CN 103289631 B * 12/2014 ............ C09J 175/04
(Continued)

OTHER PUBLICATIONS

"Improving Hot-Melt Adhesives", Adhesive & Sealants Industry Magazine, pp. 24-25, Sep. 2013(www.adhesivesmag.com).

*Primary Examiner* — Eli D Strah
(74) *Attorney, Agent, or Firm* — Kirsten Stone; Allison Johnson

(57) ABSTRACT

Disclosed is an article that includes a first substrate, a second substrate, and a re-workable adhesive composition, the first substrate being bonded to the second substrate through the adhesive composition. The adhesive composition is derived from a moisture curable polyurethane hot melt adhesive composition that includes a polyurethane prepolymer that includes the reaction product of a first crystalline polyester polyol having a number average molecular weight of from at least 5500 grams per mole (g/mol) to about 20,000 g/mol and a melting point of at least 40° C., and a polyisocyanate. The re-workable adhesive composition is cleanly removable from at least one of the first substrate and the second
(Continued)

substrate after conditioning the article at a temperature of from at least 60° C. to no greater than 100° C. for a period of about 30 minutes.

31 Claims, 2 Drawing Sheets

(51) Int. Cl.
    *H05K 1/03*     (2006.01)
    *B32B 38/10*     (2006.01)
    *B32B 43/00*     (2006.01)
    *C08G 18/48*     (2006.01)
    *C08G 18/76*     (2006.01)
    *C08G 18/12*     (2006.01)
    *C08G 18/20*     (2006.01)
    *C08G 18/40*     (2006.01)
    *C08G 18/42*     (2006.01)
    *C09J 175/04*     (2006.01)

(52) U.S. Cl.
    CPC ..... *C08G 18/2081* (2013.01); *C08G 18/4018* (2013.01); *C08G 18/4202* (2013.01); *C08G 18/4211* (2013.01); *C08G 18/4238* (2013.01); *C08G 18/4277* (2013.01); *C08G 18/4825* (2013.01); *C08G 18/7671* (2013.01); *C09J 175/04* (2013.01); *H05K 1/03* (2013.01); *H05K 5/0017* (2013.01); *B32B 2457/20* (2013.01); *B32B 2457/208* (2013.01); *C08G 2170/20* (2013.01)

(58) Field of Classification Search
    CPC ............ C08G 18/4825; C08G 18/7671; C08G 18/4211; C08G 18/2081; C08G 18/4018; C08G 18/4202; C08G 2170/20; B32B 38/10; B32B 43/006; B32B 2457/20; B32B 2457/208; H05K 1/03; H05K 5/0017

See application file for complete search history.

(56) References Cited

U.S. PATENT DOCUMENTS

| | | | |
|---|---|---|---|
| 6,365,700 | B1 | 4/2002 | Graham |
| 7,344,619 | B2 | 3/2008 | Helmeke |
| 8,659,497 | B2 | 2/2014 | Tang et al. |
| 2003/0004263 | A1 | 1/2003 | Schmidt |
| 2003/0144454 | A1 | 7/2003 | Krebs |
| 2003/0149216 | A1 | 8/2003 | Ichihashi |
| 2016/0046845 | A1* | 2/2016 | Das .................. C08G 18/7671 361/679.01 |
| 2016/0251552 | A1* | 9/2016 | Das .................. C08G 18/4213 |

FOREIGN PATENT DOCUMENTS

| | | | |
|---|---|---|---|
| EP | 0 371 370 | 6/1990 | |
| EP | 0591174 | 7/1997 | |
| EP | 1 386 936 | 2/2004 | |
| WO | WO 2012/161337 | 11/2012 | |
| WO | WO 2013/016130 | 1/2013 | |
| WO | WO 2013/016133 | 1/2013 | |
| WO | WO 2013062996 A1 * | 5/2013 | ............ C09J 7/00 |
| WO | WO 2015/016029 | 2/2015 | |
| WO | WO2015/056478 | 4/2015 | |

* cited by examiner

RE-WORKABLE MOISTURE CURABLE HOT MELT ADHESIVE COMPOSITION, METHODS OF USING THE SAME, AND ARTICLES INCLUDING THE SAME

CROSS REFERENCE TO RELATED APPLICATIONS

This application claims the benefit of U.S. Provisional Application No. 62/049,489, filed Sep. 12, 2014, and U.S. Provisional Application No. 62/037,817, filed Aug. 15, 2014, both of which are incorporated herein.

BACKGROUND

The invention relates to forming re-workable adhesive bonds.

Many components in electronic devices are very expensive. Defects can arise during the manufacture and use of these devices. Often it is desirable to try to salvage an expensive component of the device so that it can be used in another device. However, in many cases the expensive component is permanently affixed in position in the electronic device such that attempts to remove it from the device cause damage to the component.

Touch panel displays that are present on many electronic devices such as tablets and smartphones are examples of expensive components. In the manufacture and repair of electronic devices it is often desirable to remove the touch screen from the device. However, doing so can damage the touch panel.

It would be desirable to construct an electronic device in which a component of the device can be permanently maintained in a fixed position on the device but can be removed, when desired, without damaging the component.

SUMMARY

In one aspect, the invention features an electronic device that includes an electronic component, a first substrate, a second substrate, and a cured moisture curable adhesive composition derived from a polyurethane prepolymer, the first substrate being bonded to the second substrate through the adhesive composition, the cured adhesive composition being cleanly removable from at least one of the first substrate and the second substrate after conditioning the device at a temperature of from at least 60° C. to no greater than 100° C. for a period of about 30 minutes and exhibiting a Reliability Stress at Break of at least 3 MPa.

In one embodiment, the polyurethane prepolymer includes the reaction product of a first crystalline polyester polyol and a polyisocyanate. In another embodiment, the polyurethane prepolymer includes the reaction product of a first crystalline polyester polyol having a melting point greater than 40° C. and a number average molecular weight of from at least 5500 g/mol to about 20,000 g/mol, a second crystalline polyester polyol having a melting point greater than 40° C., the second crystalline polyester polyol selected from the group consisting of crystalline polyester polyol having a number average molecular weight less than 5500 g/mol and being derived from diol and polycarboxylic acid, and polycaprolactone polyol having a number average molecular weight of from 500 g/mol to about 50,000 g/mol, and a polyisocyanate.

In some embodiments, the polyurethane prepolymer includes the reaction product of a first crystalline polyester polyol having a melting point greater than 40° C. and a number average molecular weight of from at least 5500 g/mol to about 20,000 g/mol, a second crystalline polyester polyol having a melting point greater than 40° C., the second crystalline polyester polyol selected from the group consisting of crystalline polyester polyol having a number average molecular weight less than 5500 g/mol and being derived from diol and polycarboxylic acid, and polycaprolactone polyol having a number average molecular weight of from 500 g/mol to about 50,000 g/mol, polyether polyol, a third polyester polyol having a melting point no greater than 25° C., and polyisocyanate.

In other embodiments, after conditioning the device at a temperature of from at least 60° C. to no greater than 100° C. for a period of about 30 minutes, the first substrate is separable from the second substrate without damaging at least one of the first substrate and the second substrate. In some embodiments, after conditioning the device at a temperature of from at least 60° C. to no greater than 100° C. for a period of about 30 minutes, the first substrate is separable from the second substrate using a force no greater than 1 megapascal (MPa). In other embodiments, after separating the first substrate from the second substrate, any residue of the cured adhesive composition that is present on the second substrate is cleanly removable from the second substrate. In one embodiment, after separating the first substrate from the second substrate, any residue of the cured adhesive composition that is present on the second substrate is cleanly removable from the second substrate by peeling. In another embodiment, after separating the first substrate from the second substrate, any residue of the cured adhesive composition that is present on the second substrate is cleanly removable from the second substrate without the use of solvent.

In one embodiment, the second substrate includes glass, polymer, or a combination thereof. In another embodiment, the second substrate includes a touch sensitive display, a touch insensitive display, a glass panel, or a combination thereof.

In some embodiments, the first substrate includes thermoplastic polymer, thermoset polymer, metal, metal alloy, composite, polymer, or a combination thereof. In some embodiments, the second substrate is a touch sensitive display. In other embodiments, the first substrate is the housing of a personal electronic device.

In some embodiments, the electronic device is a smartphone, a tablet, a camera, a watch, or a combination thereof.

In other embodiments, the cured adhesive composition exhibits a Stress at Break at 80° C. of no greater than 1 MPa. In another embodiment, the cured adhesive composition exhibits a Stress at Break at 25° C. of at least 5 MPa and a Stress at Break at 80° C. of no greater than 1 MPa.

In one embodiment, the cured adhesive composition exhibits a peelability of at least 4.

In another embodiment, after conditioning the device at 85° C. and 85% relative humidity for a period of 72 hours and cooling the device to room temperature, the first substrate remains permanently bonded to the second substrate.

In one embodiment, the cured adhesive composition exhibits a Reliability Stress at Break of at least 4 MPa. In some embodiments, the cured adhesive composition exhibits a Reliability Stress at Break of at least 5 MPa.

In other embodiments, the cured adhesive composition exhibits strength retention of at least 30%. In another embodiment, the cured adhesive composition exhibits strength retention of at least 50%.

In one embodiment, the first crystalline polyester polyol has a number average molecular weight of from about 6000 g/mol to no greater than 20,000 g/mol. In other embodiments, the first crystalline polyester polyol has a number average molecular weight from about 6000 g/mol to about 15,000 g/mol and the second crystalline polyester polyol has a number average molecular weight of from about 1000 g/mol to about 5000 g/mol. In one embodiment, the first crystalline polyester polyol has a number average molecular weight from about 6000 g/mol to about 12,000 g/mol and the second crystalline polyester polyol has a number average molecular weight from about 2000 g/mol to about 4500 g/mol.

In some embodiments, the polyether polyol has a number average molecular weight of from about 400 g/mol to about 8000 g/mol.

In another embodiment, the third polyester polyol has a number average molecular weight of from about 250 g/mol to about 6000 g/mol.

In another embodiment, the first crystalline polyester polyol includes the reaction product of diol and polycarboxylic acid and the second crystalline polyester polyol includes polycaprolactone polyol. In some embodiments, the first crystalline polyester polyol has a number average molecular weight of from about 6000 g/mol to about 12,000 g/mol and the polycaprolactone polyol has a number average molecular weight of from about 1000 g/mol to about 20,000 g/mol.

In another embodiment, the electronic device includes an electronic component, a first substrate, a second substrate, and a cured moisture curable hot melt adhesive composition derived from a polyurethane prepolymer, the first substrate being bonded to the second substrate through the adhesive composition, the cured adhesive composition being cleanly removable from at least one of the first substrate and the second substrate after conditioning the device at a temperature of from at least 60° C. to no greater than 100° C. for a period of about 30 minutes, and after conditioning the device at 85° C. and 85% relative humidity for a period of 72 hours and cooling the device to room temperature, the first substrate remains permanently bonded to the second substrate.

In other aspects, the invention features a method of reworking an article, the method including conditioning the article at a temperature of from at least 60° C. to no greater than 100° C. for a period of about 30 minutes, the article including a first substrate, a second substrate, and a cured moisture curable polyurethane hot melt adhesive composition, the first substrate being bonded to the second substrate through the cured adhesive composition, and separating the first substrate from the second substrate without damaging at least one of the first substrate and the second substrate.

In one embodiment, the separating includes applying a force of no greater than 1 MPa to separate the first substrate from the second substrate. In another embodiment, the separating is performed by a human and includes gripping at least a portion of the first substrate with a first hand and gripping at least a portion of the second substrate with a second hand and forcing the two substrates apart from each. In some embodiments, after separating the two substrates, the method further includes cleanly removing the adhesive composition from the first substrate. In other embodiments, after separating the two substrates, the method further includes cleanly removing the adhesive composition from the first substrate using a peeling force. In one embodiment, the article is an electronic device.

In other aspects, the invention features a moisture curable polyurethane adhesive composition includes a polyurethane prepolymer that includes the reaction product of a first crystalline polyester polyol having a melting point greater than 40° C., a softening point no greater than 120° C., and a number average molecular weight of at least 5500 g/mol to no greater than 20,000 g/mol, a second crystalline polyester polyol having a melting point greater than 40° C., a softening point no greater than 95° C., and a number average molecular weight of from about 500 g/mol to about 50,000 g/mol, second crystalline polyester polyol being different from the first crystalline polyester polyol, a third polyester polyol having a melting point no greater than 40° C., polyether polyol, and polyisocyanate, the adhesive composition exhibiting a Stress at Break at 25° C. of at least 5 MPa and a Stress at Break at 80° C. of no greater than 1 MPa, and being cleanly removable from a polycarbonate substrate within one minute of testing according to the Stress at Break at 80° C. test method. In one embodiment, the a polyurethane prepolymer includes the reaction product of from 15% by weight to 99.5% by weight of the first crystalline polyester polyol, from 1% by weight to 40% by weight of the second crystalline polyester polyol, and from 10% by weight to 60% by weight of the third polyester polyol.

In another aspect, the invention features an article that includes a first substrate, a second substrate, and a cured adhesive composition, the first substrate being bonded to the second substrate through the cured adhesive composition, the cured adhesive composition being derived from a polyurethane prepolymer that includes the reaction product of a first crystalline polyester polyol having a number average molecular weight of from at least 5500 g/mol to 20,000 g/mol, a melting point greater than 40° C., and a softening point no greater than 120° C., a second crystalline polyester polyol having a melting point greater than 40° C., a softening point no greater than 95° C., and a number average molecular weight of from about 500 g/mol to about 50,000 g/mol, the second crystalline polyester polyol being different from the first crystalline polyester polyol, and polyisocyanate, the adhesive composition being cleanly removable from at least one of the first substrate and the second substrate after conditioning the article at a temperature of from at least 60° C. to no greater than 100° C. for a period of about 30 minutes and without the use of solvent or abrasive action.

The invention features an article in which two substrates are permanently bonded to each other through an adhesive composition, but can be separated from each other upon heating. The invention also features an article in which the adhesive composition, once exposed as a result of separating the two substrates, can be cleanly removed from at least one of the substrates.

Other features and advantages will be apparent from the following description of the preferred embodiments, the claims, and the drawings, in which like numerals have been used to indicate like features.

GLOSSARY

Figure 1:
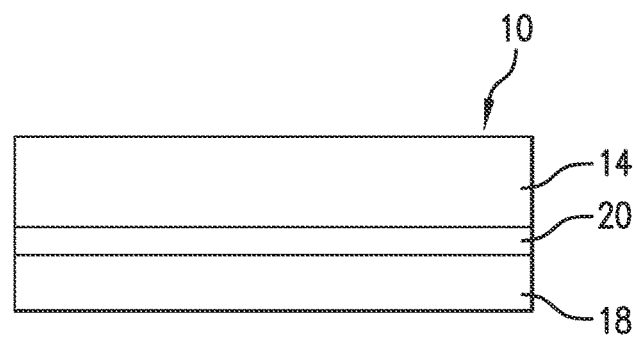
FIG. 1 is a side view of a re-workable article.

In reference to the invention, these terms have the meanings set forth below:

The term "cleanly removable" when used in reference to an adhesive composition means the adhesive is removable from a substrate such that no visible adhesive residue remains on the substrate, as determined by the unaided human eye.

The term "crystalline" means having a melt transition (Tm) when measured using Differential Scanning Calorimetry.

The terms "permanent" and "permanently" when used in conjunction with an adhesive bond formed between two substrates mean that substrate failure will occur if an attempt is made to separate the two substrates of the bond at room temperature.

DETAILED DESCRIPTION

The article 10 includes two substrates 14, 18 bonded together through a cured moisture curable polyurethane hot melt adhesive composition 20. At room temperature, the substrates cannot be separated from each other without damaging at least one of the substrates. After conditioning the article in an oven maintained at a temperature of at least 60° C., at least 70° C., or even at least 80° C., for a period of about 30 minutes, the substrates can be separated by pulling the substrates apart from each other by hand, preferably using a force of no greater than 1 MPa. In some embodiments, the substrates can be separated from each other after about 20 minutes or even after about 10 minutes of elevated temperature conditioning.

One method of determining whether the two substrates of the article can be separated from each other at an elevated temperature is the Stress at Break at 80° C. test method modified such that the two polycarbonate substrates referred to therein are the substrates of the article. Preferably the article exhibits a Stress at Break of no greater than 1 MPa when tested according to such a modified Stress at Break at 80° C. test method.

After conditioning the article at an elevated temperature of at least 60° C., at least 70° C., or even at least 80° C., for a period of about 30 minutes, and within one minute after removing the article from the elevated temperature conditioning and separating the two substrates of the article from one another, the cured adhesive composition also is cleanly removable from at least one of the substrates without the aid of solvent or abrasive action. Elevated temperature clean removability of the adhesive composition can be assessed after the two substrates have been separated from one another so as to expose the adhesive composition. One method of measuring the elevated temperature clean removability of the exposed adhesive composition involves grasping a portion of the exposed adhesive composition between two fingers and peeling the portion of adhesive composition away from the substrate. Preferably the entire volume of the portion of adhesive residue present on a substrate can be removed from the substrate in no greater than 4 pieces, no greater than 3 pieces, no greater than 2 pieces, or even as a single piece, when tested according to the Peelability test method within one minute, within three minutes, or even within five minutes, after the article has been removed from an elevated temperature conditioning chamber where it had been conditioned at a temperature of at least 60° C., at least 70° C., or even at least 80° C., for a period of 30 minutes, and the substrates have been separated. The peelability performance of the adhesive composition can be graded according to the Peelability Grading Scale set forth herein. The adhesive composition preferably is cleanly removable from at least one of the substrates such that it exhibits a peelability of at least 3, at least 4, or even at least 5 when graded according to the Peelability Grading Scale.

The adhesive bond of the article also preferably maintains good reliability such that after exposure to relatively high temperatures and high humidity, the substrates will remain bonded to each other when tested at room temperature and ambient humidity. Preferably the two substrates remain bonded to each other through the cured adhesive composition after conditioning at 85° C. and 85% relative humidity for seventy-two hours (as determined after the article has cooled to room temperature). One measure of the strength of the bond is stress at break. Preferably the stress at break of the article after exposure to 85° C. and 85% relative humidity for a period of seventy-two hours (as determined after the article has cooled to room temperature) is at least 50%, at least 60%, at least 70% or even at least 75% of the initial Stress at Break, i.e., the Stress at Break at 25° C. prior to the conditioning. Preferably the stress at break of the article after exposure to 85° C. and 85% relative humidity for a period of seventy-two hours is at least 3 MPa, at least 4 MPa, or even at least 5 MPa.

The first and second substrates of the article can be made from a variety of materials having a variety of properties. Useful substrates include rigid substrates (i.e., the substrate cannot be bent by an individual using two hands or will break if an attempt is made to bend the substrate with two hands), and flexible substrates (i.e., the substrate can be bent using the force of two hands and can return to its original shape after bending). Preferably at least one of the substrates is transparent or translucent or includes a transparent or translucent component. Useful substrates include glass (e.g., alkali-aluminosilicate toughened glass and borosilicate glass), quartz, boron nitride, gallium nitride, sapphire, silicon, carbide, ceramic, polymer (e.g., polycarbonate, polyolefin (e.g., polypropylene, polyethylene, low density polyethylene, linear low density polyethylene, high density polyethylene, polypropylene, and oriented polypropylene, copolymers of polyolefins and other comonomers), polyether terephthalate, ethylene-vinyl acetate, ethylene-methacrylic acid ionomers, ethylene-vinyl-alcohols, polyesters, e.g. polyethylene terephthalate, polycarbonates, polyamides, e.g. Nylon-6 and Nylon-6,6, polyvinyl chloride, polyvinylidene chloride, cellulosics, polystyrene, and epoxy), polymer composites (e.g., composites of a polymer and metal, cellulose, glass, polymer, and combinations thereof), metal (aluminum, copper, zinc, lead, gold, silver, platinum, and magnesium, and metal alloys such as steel, tin, brass, and magnesium and aluminum alloys), carbon-fiber composite, other fiber-based composite, graphene, fillers, and combinations thereof. The fillers can be in a variety of forms including, e.g., particles (spherical particles, beads, and elongated particles), fibers, and combinations thereof.

The substrates can be of a single material and a single layer or can include multiple layers of the same or different material. The layers can be continuous or discontinuous.

The substrates can be components of a variety of articles including, e.g., components of electronic devices (e.g., a display of an electronic device, e.g., a glass panel, a touch sensitive screen, a touch insensitive screen, a liquid crystal display, and a polymer panel), a cover, a frame, a housing (e.g., a housing of an electronic device), a film, a conductive layer, a protective layer, an ink layer, and components of a light bulb (e.g., bulb, screw base, and LED housing).

The article can be any of a variety of articles including, e.g., electronic devices (e.g., handheld electronic devices (e.g., phones (e.g., cellular telephones and cellular smartphones), cameras, tablets, electronic readers, monitors (e.g., monitors used in hospitals, and by healthcare workers, athletes and individuals), calculators, mice, touch pads, and joy sticks), wearable electronic devices (e.g., wrist watches and eyeglasses), computers (e.g., desk top and lap top computers), computer monitors, televisions, media players, appliances (e.g., refrigerators, washing machines, dryers, ovens, and microwaves), light bulbs (e.g., incandescent, light emitting diode, and fluorescent), and articles that include a visible transparent or transparent component, glass housing structures, protective transparent coverings for a display or other optical component.

Figure 2:
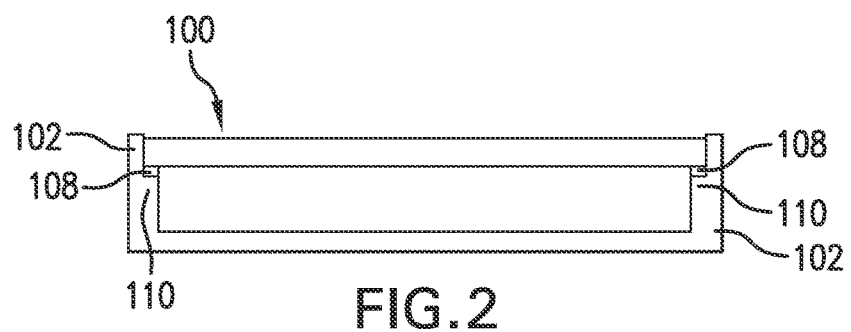
FIG. 2 is a cross-sectional view of one embodiment of a re-workable electronic device.
Figure 3:
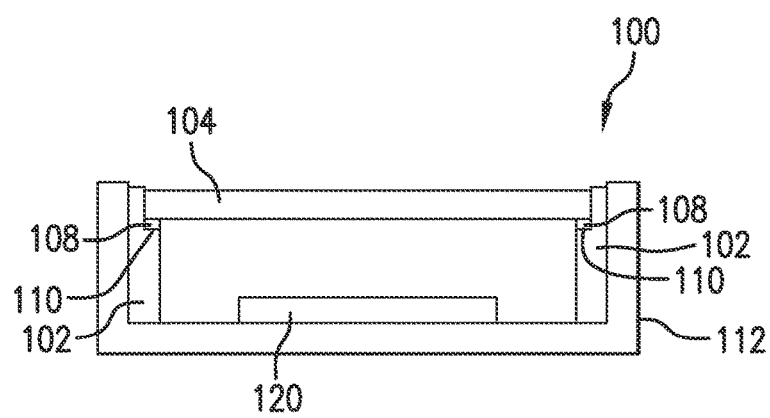
FIG. 3 is a cross-sectional view of another embodiment of a re-workable electronic device.
Figure 4:
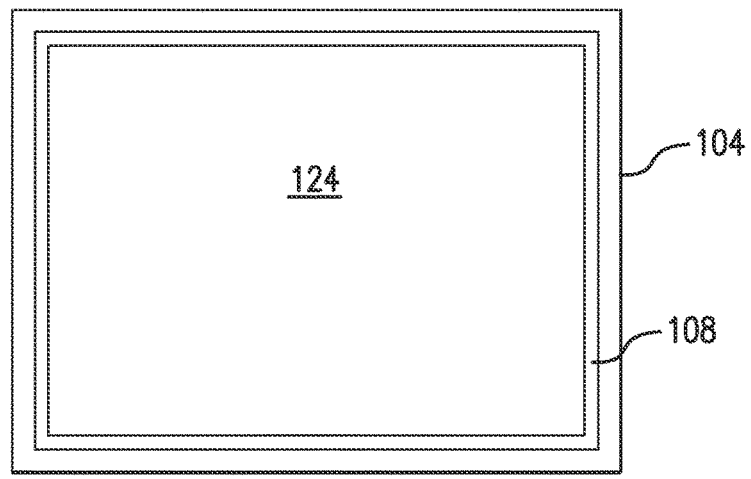
FIG. 4 is a bottom view of the interior surface of the display the re-workable electronic device of FIG. 3.
Figure 5:
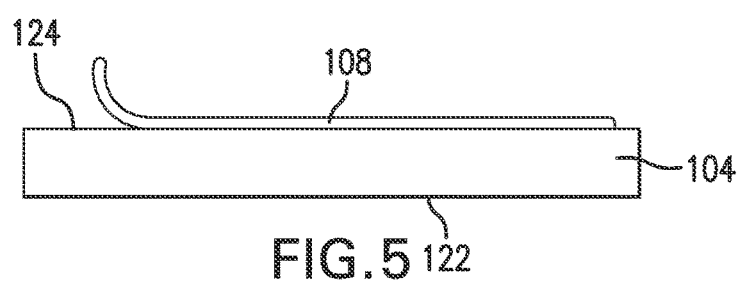
FIG. 5 is a side view of a modified display of FIG. 4.

In one embodiment, the article 100 is an electronic device that includes a housing, 112, a frame 102, a cured moisture curable polyurethane hot melt adhesive composition 108, a display 104 bonded to the frame 102 through the adhesive composition 108, and electrical components 120 (e.g., electronic circuit, conductive elements, battery, chip, and combinations thereof) mounted between the housing 112 and the display 104. The frame 102 includes structures 110 that receive at least part of the display 104, as shown in FIGS. 1-3. The display 104 can be separated from the frame 102 after conditioning the article 100 at a temperature of at least about of at least 60° C., at least 70° C., or even at least 80° C., for a period of about 30 minutes (i.e., elevated temperature conditioning). The display 104 can be separated from the frame 102 after conditioning the article 100 at a temperature of at least about of at least 60° C., at least 70° C., or even at least 80° C., for a period of about 30 minutes (i.e., elevated temperature conditioning). Separating the display 104 from the frame 102 can result in adhesive failure to the display 104 or or to the frame 102. Alternatively the adhesive composition can exhibit cohesive failure upon separation of the display 104 from the frame 102. Once the display 104 is separated from the frame 102, and within one minute after the elevated temperature conditioning, the exposed adhesive composition 108 is cleanly removable from the display 104, the frame 102, or both, by peeling and without the use of solvent or mechanical abrasion. Exposed adhesive residue 108 on the interior surface 124 of the display 104 opposite the exterior surface 122 of the display 104, is illustrated in FIGS. 4 and 5.

In some embodiment, the exterior surface 122 of the display 104 is touch sensitive. In other embodiments, the exterior surface 122 of the display 104 is touch insensitive.

The display can include a number of layers and components including, e.g., display structures with image pixels formed from light-emitting diodes (LEDs), organic LEDs (OLEDs), light directional films, dielectric films, transparent polymers (e.g., polycarbonate and polyethylene terephthalate), plasma cells, electronic ink elements, electrowetting pixels, electrophoretic pixels, and liquid crystal display (LCD) components, touch sensor electrodes with touch sensing capabilities (e.g., touch sensing capabilities based on resistive systems, capacitive layer systems, surface acoustic wave systems, optical touch systems, piezoelectric touch sensor systems, and other force sensors systems), ink coatings (e.g., ink coated polymer films and ink coated glass), and combinations thereof.

In some embodiments, the display includes an LCD layer covered by a layer of glass, sensing lines are bonded to the glass layer and driving lines are bonded to the sensing lines. In other embodiments, an electrode layer is disposed on top of the glass substrate. The display optionally includes a protective cover and an anti-reflective coating.

The display also and additionally can be formed from or include the materials set forth above in reference to the materials from which the substrates can be made and preferably includes a transparent or translucent component. The frame and housing can be of a variety of materials including, e.g., the materials set forth above in reference to the materials from which the substrates can be made.

Adhesive Composition

The cured adhesive composition is derived from a moisture curable polyurethane hot melt adhesive composition that includes a polyurethane prepolymer that is the reaction product of a first crystalline polyester polyol that has a number average molecular weight of at least 5500 g/mol to about 20,000 g/mol and a melting point greater than 40° C., and a polyisocyanate. The adhesive composition exhibits a Stress at Break at 25° C. of at least 4 MPa, at least 5 MPa, or even at least 7 MPa when tested according to the Stress at Break at 25° C. test method.

The cured adhesive composition is re-workable. One useful measure of the re-workability of the cured adhesive composition includes a measure of the ease with which two substrates that are bonded together through the cured adhesive composition can be separated from each other at an elevated temperature. Preferably the cured adhesive composition exhibits a Stress at Break of no greater than 1.5 MPa, or even no greater than 1 MPa when tested according to the Stress at Break at 80° C. test method.

Another useful measure of the re-workability of the cured adhesive composition includes a measure of its elevated temperature clean removability, i.e., the ease with which the cured adhesive composition can be removed from the substrate(s) to which it remains adhered after the two substrates have been separated from one another at an elevated temperature. The cured adhesive composition is cleanly removable from a polycarbonate substrate within one minute, within two minutes, or even within five minutes, after conditioning at a temperature of at least 60° C., at least 70° C., or even at least 80° C., for a period of about 30 minutes; preferably it is cleanly removable from the substrate by peeling. Preferably the cured adhesive composition can be peeled off of the polycarbonate substrate in less than five pieces, in less than three pieces, or even in one piece after conditioning at a temperature of at least 60° C., at least 70° C., or even at least 80° C., for a period of about 30 minutes. One useful method of measuring clean removability of the cured adhesive composition is the Peelability test method set forth herein. Preferably the adhesive composition exhibits a peelability of at least 3, at least 4, or even at least 5.

The cured adhesive composition also preferably exhibits good reliability. One measure of reliability is the ability of the cured adhesive composition to maintain a strong bond after conditioning at 85° C. and 85% relative humidity for seventy-two hours. The cured adhesive composition exhibits a Reliability Stress at Break (i.e., the stress at break after conditioning at 85° C. and 85% relative humidity for seventy-two hours as measured at room temperature) of at least 3 MPa, at least 4 MPa, or even at least 5 MPa when tested according to the Reliability Stress at Break test method. The cured adhesive composition also preferably exhibits a strength retention after conditioning at 85° C. and 85% relative humidity for seventy-two hours that is at least 50%, at least 60%, at least 70% or even at least 75% relative to its initial Stress at Break at 25° C. as determined using the Strength Retention Calculation.

The moisture curable polyurethane hot melt adhesive composition preferably has a viscosity of less than about 20,000 centipoise (cPs), from about 1000 cPs to about 10,000 cPs, or even from about 2000 cPs to about 6000 cPs at 120° C.

First Crystalline Polyester Polyol

The first crystalline polyester polyol has a melting point greater than 40° C., or even from greater than 40° C. to about 120° C., and a number average molecular weight of at least 5500 g/mol, from about 6,000 g/mol to about 20,000 g/mol, from about 6,500 g/mol to about 15,000 g/mol, from about 7,000 g/mol to about 12,000 g/mol, from about 7,000 g/mol to less than 10,000 g/mol, or even from about 7,000 g/mol to no greater than 9500 g/mol. The first crystalline polyester polyol has a glass transition temperature (Tg) of no greater than 0° C. Useful first crystalline polyester polyols include crystalline polyester polyols having a softening point of no greater than 120° C., no greater than 110° C., no greater than 100° C., or even no greater than 90° C., as measured according to ring and ball method ISO 4625.

Suitable crystalline polyester polyols include, e.g., crystalline polyester polyols formed from a diol (e.g., an aliphatic diol having a carbon chain of at least 2 carbon atoms or a cycloaliphatic diol) and an aliphatic diacid. Examples of suitable aliphatic diols include 1,2-ethanediol, 1,4-butanediol, 1,5-pentanediol, 1,6-hexanediol, 1,8-octanediol, and 1,10-decanediol. Examples of suitable cycloaliphatic diols include 1,4-cyclohexanediol and 1,4-cyclohexanedimethanol. Examples of suitable aliphatic diacids include adipic acid, 1,12-dodecanedioic acid, sebacic acid, terephthalic acid, succinic acid, glutaric acid, dimerized fatty acids, and combinations thereof.

Other suitable crystalline polyester polyols are formed from polycaprolactone and diol including, e.g., diethylene glycol, 1,4-butane diol, neopentyl glycol, 1,6-hexane diol, and combinations thereof.

Specific examples of suitable crystalline polyester polyols include poly(hexanediol adipate)polyol, poly(butanediol adipate)polyol, poly-epsilon-caprolactone polyol, poly-hexanediol dodecanedioic acid)polyol, and combinations thereof.

Suitable commercially available crystalline polyester polyols are sold under the DYNACOLL series of trade designations from Evonik Industries AG (Germany) including DYNACOLL 7361; hexanediol adipate, STEPANOL series of trade designations from Stepan Company (Northfield, Ill.) including STEPANOL PC 105-10 hexanediol adipate, and under the CAPA series of trade designations from Perstorp Polyols Inc. (Toledo, Ohio) including CAPA 2402, 6100, 6200 and 6400 caprolactone polyols.

The polyurethane prepolymer preferably is derived from about 1% by weight to 60% by weight, from 1% by weight to 40% by weight, from 2% by weight to 20% by weight, or even from 3% by weight to 10% by weight, based on the weight of the polyurethane prepolymer, first crystalline polyester polyol.

Polyisocyanate

The polyisocyanate includes at least two isocyanate (—NCO) groups. Useful polyisocyanates include, e.g., aromatic, aliphatic, cyclopaliphatic, arylalkyl, and alkylaryl, di-, tri-, and tetra-isocyanates, and mixtures thereof. Suitable polyisocyanates can be in a variety of forms including, e.g., monomers, oligomers, and mixtures thereof. Useful aromatic polyisocyanates include, e.g., diphenylmethane diisocyanate compounds (MDI) including its isomers (e.g., diphenylmethane 4,4'-diisocyanate, diphenylmethane-2,2'-diisocyanate, diphenylmethane-2,4'-diisocyanate, oligomeric methylene isocyanates having the formula

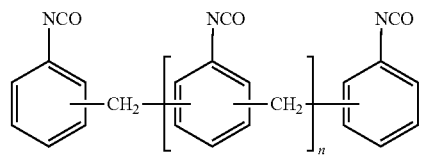

where n is an integer of from 0 to 5, and mixtures thereof), carbodiimide modified MDI, naphthalene diisocyanates including isomers thereof (e.g., 1,5-naphthalene diisocyanate (NDI)), isomers of triphenylmethane triisocyanate (e.g., triphenylmethane-4,4',4"-triisocyanate), toluene diisocyanate compounds (TDI) including isomers thereof, 1,3-xylene diisocyanate (XDI), tetramethylxylene diisocyanate (TMXDI) (e.g., p-1,1,4,4-tetramethylxylene diisocyanate (p-TMXI) and m-1,1,3,3-tetramethylxylylene diisocyanate (m-TMXDI)), and mixtures thereof.

Useful aliphatic polyisocyanates include, e.g., hexamethylene diisocyanate (HDI), isophorone diisocyanate (IPDI), hydrogenated diphenylmethane diisocyanate, 1,6-diisocyanato-2,4,4-trimethylhexane, 1,4-cyclohexane diisocyanate (CHDI), 1,4-cyclohexanebis(methylene isocyanate) (BDI), 1,3-bis(isocyanatomethyl)cyclohexane ($H_6$XDI), dicyclohexylmethane diisocyanate ($H_{12}$ MDI), and mixtures thereof.

Useful polyisocyanates are commercially available under a variety of trade designations including, e.g., ISONATE 125M pure diphenylmethane diisocyanate (MDI), from Dow Chemical Co. (Midland, Mich.), MONDUR M from Bayer Chemicals (Pittsburgh, Pa.), ISONATE 50 OP and ISONATE 125M from Dow Chemical Company (Midland, Mich.), and LUPRANATE M from BASF (Germany).

Optional Second Crystalline Polyester Polyol

The polyurethane prepolymer optionally is also derived from at least one second crystalline polyester polyol having a melting point greater than 40° C. and being different from the first crystalline polyester polyol. The second crystalline polyester polyol has a number average molecular weight of from about 500 g/mol to about 50,000 g/mol. Useful second crystalline polyester polyols include crystalline polyester polyols having a softening point of no greater than 100° C., no greater than 95° C., no greater than about 90° C., or even no greater than about 80° C., as measured according to ring and ball method ISO 4625.

When the polyurethane prepolymer includes the reaction product of at least two crystalline polyester polyols having a melting point greater than 40° C., a variety of blends are suitable including, e.g., two crystalline polyester polyols that are compositionally similar but differ in molecular weight, two crystalline polyester polyols that are compositionally different but similar in molecular weight, and two crystalline polyester polyols that are compositionally different and differ in molecular weight.

Suitable second crystalline polyester polyols include crystalline polyester polyols derived from diol and an aliphatic diacid, polycaprolactone polyols, and blends thereof.

For those crystalline polyester polyols derived from diol and an aliphatic diacid, suitable diols include, e.g., aliphatic diols having a carbon chain of at least 2 carbon atoms and cycloaliphatic diols. Suitable aliphatic diols include, e.g., 1,4-butane diol, 1,5-pentane diol, 1,6-hexane diol, 1,8-octanediol, and 1,10-decanediol. Suitable cycloaliphatic diols include, e.g., 1,4-cyclohexanediol and 1,4-cyclohexanedimethanol. Suitable aliphatic diacids include, e.g., adipic acid, 1,12-dodecanedioic acid, sebacic acid, terephthalic acid, succinic acid, glutaric acid, dimerized fatty acids, and combinations thereof. Specific examples of suitable crystalline polyester polyols include poly(hexanediol adipate) polyol, poly(butanediol adipate)polyol, poly-epsilon-caprolactone polyol, polyhexanediol dodecanedioic acid)polyol, and combinations thereof. Useful second crystalline polyester polyols derived from diol and diacid have a number average molecular weight of the second crystalline polyester polyol preferably is less than 5500 g/mol, from about 500 g/mol to about 5,000 g/mol, from about 1,000 g/mol to about 4000 g/mol, or even from about 2000 g/mol to about 4,000 g/mol.

When the polyurethane prepolymer is derived from at least two crystalline polyester polyols having a melting point greater than 40° C. where the second crystalline polyester polyol derived from diol and diacid, a useful ratio of weight of the first crystalline polyester polyol to weight of second crystalline polyester polyol is from about 10:90 to about 90:10, from about 10:90 to about 50:50, or even from about 15:85 to about 50:50.

Suitable crystalline polycaprolactone polyols are derived from polycaprolactone and diol including, e.g., diethylene glycol, 1,4-butane diol, neopentyl glycol, 1,6-hexane diol, and combinations thereof. Crystalline polycaprolactone polyols suitable for the second crystalline polyester polyol have a number average molecular weight from about 500 g/mol to about 50,000 g/mol, from about 1000 g/mol to about 20,000 g/mol, from about 1,000 g/mol to about 10,000 g/mol, or even from about 2000 g/mol to about 6,000 g/mol.

When the polyurethane prepolymer is derived from at least two crystalline polyester polyols having a melting point greater than 40° C. where the second crystalline polyester polyol is a polycaprolactone polyol, a useful ratio of weight of the first crystalline polyester polyol to weight of polycaprolactone polyol is from about 1:99 to about 40:60, from about 2:98 to about 30:70, or even from about 3:97 to about 20:80.

Suitable second crystalline polyester polyols are commercially available under a variety of trade designations including, e.g., under the DYNACOLL series of trade designations from Evonik Industries AG (Germany) including DYNACOLL 7360 and 7363 hexanediol adipates, under the PIOTHANE series of trade designations from Panolam Industries Int'l, Inc. (Auburn, Me.) including, e.g., PIOTHANE 2000HA hexanediol adipate and 3000HA hexanediol adipate, and under the CAPA series of trade designations from Perstorp Polyols Inc. (Toledo, Ohio) including CAPA 2402, 6100, 6200 and 6400 polycaprolactone polyols.

The polyurethane prepolymer is derived 0% by weight to about 40% by weight, from about 1% by weight to about 40% by weight, from about 2% by weight to about 35% by weight, or even from about 10% by weight to about 30% by weight, based on the weight of the polyurethane prepolymer, second crystalline polyester.

Optional Third Polyester Polyol

The polyurethane prepolymer optionally is derived from a third polyester polyol. The third polyester polyol has a Tg less than 100° C. and a melting point no greater than 40° C. The third polyester polyol can be crystalline or amorphous. The third polyester polyol has a number average molecular weight of from about 250 g/mol to about 6000 g/mol, from about 1000 g/mol to about 3,000 g/mol, or even from about 1000 g/mol to about 2,000 g/mol.

The third polyester polyol is the reaction product of a polyacid, or an anhydride, ester or halide thereof, and a stoichiometric excess of polyol. Suitable polyacids include diacids (e.g., dicarboxylic acids), triacids (e.g., tricarboxylic acids), and higher order acids. Suitable polyacids include, e.g., aromatic dicarboxylic acids, anhydrides and esters thereof (e.g. terephthalic acid, isophthalic acid, dimethyl terephthalate, diethyl terephthalate, phthalic acid, phthalic anhydride, methyl-hexahydrophthalic acid, methyl-hexahydrophthalic anhydride, methyl-tetrahydrophthalic acid, methyl-tetrahydrophthalic anhydride, hexahydrophthalic acid, hexahydrophthalic anhydride, and tetrahydrophthalic acid), aliphatic dicarboxylic acids and anhydrides thereof (e.g. maleic acid, maleic anhydride, succinic acid, succinic anhydride, glutaric acid, glutaric anhydride, adipic acid, pimelic acid, suberic acid, azelaic acid, sebacic acid, chlorendic acid, 1,2,4-butane-tricarboxylic acid, decanedicarboxylic acid, octadecanedicarboxylic acid, dimeric acid, dimerized fatty acids, trimeric fatty acids, and fumaric acid), and alicyclic dicarboxylic acids (e.g. 1,3-cyclohexanedicarboxylic acid, and 1,4-cyclohexanedicarboxylic acid), isophthalic acid, terephthalic acid, and combinations thereof.

Examples of suitable polyols from which the third polyester polyol can be derived include aliphatic polyols, e.g., ethylene glycols, propane diols (e.g., 1,2-propanediol and 1,3-propanediol), butane diols (e.g., 1,3-butanediol, 1,4-butanediol, and 1,2-butanediol), 1,3-butenediol, 1,4-butenediol, 1,4-butynediol, pentane diols (e.g., 1,5-pentanediol), pentenediols, pentynediols, 1,6-hexanediol, 1,8-octanediol, 1,10-decanediol, neopentyl glycol, diethylene glycol, triethylene glycol, tetraethylene glycol, polyethylene glycols, propylene glycol, polypropylene glycols (e.g., dipropylene glycol and tripropylene glycol), 1,4-cyclohexanedimethanol, 1,4-cyclohexanediol, dimer diols, bisphenol A, bisphenol F, hydrogenated bisphenol A, hydrogenated bisphenol F, glycerol, tetramethylene glycol, polytetramethylene glycol, 3-methyl-1,5-pentanediol, 1,9-nonanediol, 2-methyl-1,8-octanediol, and trimethylolpropane, pentaerythritol, sorbitol, glucose, and combinations thereof.

Specific examples of useful third polyester polyols include polyglycol adipates, polyethylene terephthalate polyols, polycaprolactone polyols and polycaprolactone triols.

Useful third polyester polyols are commercially available under a variety of trade designations including, e.g., DESMOPHEN S 107-55 from Bayer Corp. (Pittsburgh, Pa.), and DYNACOLL 7250 from Evonik Industries AG (Germany), STEPANPOL PN-110 neopentylglycol phthalate from Stepanol Company (Northfield, Ill.) and PIOTHANE 2000NA neopentyl glycol adipate from Panolam Industries Int'l, Inc. (Auburn, Me.).

The polyurethane prepolymer preferably is derived from 0% by weight to about 60% by weight, from about 10% by weight to about 60% by weight, or even from about 20% by weight 50% by weight, based on the weight of the polyurethane prepolymer, third polyester polyol.

Optional Polyether Polyol

The polyurethane prepolymer optionally is additionally derived from a polyether polyol. The polyether polyol has a number average molecular weight of from about 400 g/mol to about 8000 g/mol, from about 500 g/mol to about 4000 g/mol, or even from about 1000 g/mol to about 2000 g/mol. The polyether polyol is derived from oxide monomers (e.g., ethylene oxide, propylene oxide, 1,2-butylene oxide, 1,4-butylene oxide, tetrahydrofuran, and combinations thereof) and a polyol initiator (e.g., ethylene glycol, propylene glycol, butanediols, hexanediols, glycerols, trimethylolethane, trimethylolpropane, and pentaerythritol, and combinations thereof). Suitable polyether polyols include, e.g., homopolymers of propylene oxide, ethylene oxide, and butylene oxide, copolymers of propylene oxide and ethylene oxide, copolymers of propylene oxide and butylene oxide, copolymers of butylene oxide and ethylene oxide, and mixtures thereof. Specific examples of suitable polyether polyols include, e.g., polyethylene glycol, polytetramethylene glycol, polypropylene glycol, polybutadiene glycol, and combinations thereof. The polyether polyol copolymers can have a variety of configurations including, e.g., random and block configurations.

Suitable commercially available polyether polyols are available under a variety of trade designations including, e.g., TERATHANE 2000 polyether glycol (Invista North America S.A.R.L. Corporation Luxembourg, Wichita, Kans.), ARCOL PPG-2000 and PPG-1000 polypropylene glycols (Bayer Material Science LLC, Pittsburgh, Pa.), and PolyG polypropylene glycol from Monument Chemical Kentucky LLC (Brandenburg, Ky.).

The polyurethane prepolymer preferably is derived from about 0% by weight to about 60% by weight, from about 10% by weight to about 60% by weight, from about 10% by weight to about 50% by weight, or even from about 20% by weight to about 40% by weight, based on the weight of the polyurethane prepolymer, polyether polyol.

Catalyst

A catalyst optionally is used in the polymerization of the polyurethane prepolymer. A variety of metal catalysts are suitable including, e.g., catalysts based on tin (e.g. dibutyltin dilaurate and dibutyltin acetate), bismuth, zinc, and potassium. The polyurethane prepolymer can be prepared from about 0.01% by weight to about 2% by weight, based on the weight of the polyurethane prepolymer, catalyst.

Preparation of Polyurethane Prepolymer

The polyurethane prepolymer can be prepared by reacting the polyols with the polyisocyanate at an elevated temperature of from greater than 40° C. to about 200° C. The polyol may first be introduced into a reaction vessel, heated to reaction temperatures and dried under vacuum to remove ambient moisture absorbed by the polyols. The polyisocyanate is then added to the reactor. The reaction between the polyols and the polyisocyanate is conducted at an NCO:OH ratio of from about 1.3:1 to about 6.7:1 or even from about 1.5:1 to about 2.5:1 to obtain an isocyanate content in the final adhesive of from about 1% by weight to about 10% by weight, or even from about 2% by weight to about 6% by weight, based on the total weight of the polyurethane prepolymer.

The polyurethane polymer, optionally formulated with additional additives, is packaged in a suitable moisture proof container.

Catalyst

The moisture curable polyurethane hot melt adhesive composition optionally includes a catalyst to facilitate moisture cure. Useful catalysts include catalyst that include ether and morpholine functional groups, examples of which include 2,2-dimorpholinoethyl ether, di(2,6-dimethyl morpholinoethyl)ether, and 4,4'-(oxydi-2,1-ethanediyl)bis-morpholine. Suitable commercially available catalysts include, e.g., JEFFCAT DMDEE 4,4'-(oxydi-2,1-ethanediyl)bis-morpholine, which is available from Huntsman Corp. (Houston, Tex.).

When catalyst is present in the moisture curable composition, it is preferably present in an amount of from about 0.01% by weight to about 2% by weight catalyst based on the total weight of the moisture curable hot melt adhesive composition.

Additional Additives

The moisture curable hot melt adhesive composition optionally includes a variety of other additives including, e.g., thermoplastic polymer, tackifying agent, plasticizer, wax, stabilizer, antioxidant, fillers (tales, clays, silicas and treated versions thereof, carbon blacks and micas), ultraviolet (UV) scavengers and absorbers, pigments, fluorescing agents, odor masks, adhesion promoters (i.e., silane-based adhesion promoters), surfactants, defoamers, and combinations thereof.

Useful thermoplastic polymers include, e.g., ethylene vinyl acetate, ethylene vinyl acetate and vinyl alcohol copolymer, ethylene vinyl butyrate, ethylene acrylic acid, ethylene methacrylic acid, ethylene acrylamide copolymer, ethylene methacrylamide, acrylate copolymers (e.g., methyl acrylate, ethyl acrylate, methylmethacrylate, 2-ethylhexylacrylate, 2-ethylhexylmethacrylate, methoxyethylmethacrylate, methoxyethylacrylate, ethylene ethyl acrylate, ethylene n-butyl acrylate, and ethylene hydroxyethyl acrylate), ethylene n-butyl acrylate carbon-monoxide terpolymer, polyolefins (e.g., polypropylene and polyethylene), thermoplastic polyurethane, butylene/poly(alkylene ether) phthalate, thermoplastic polyester, and combinations thereof.

Useful tackifying agents include, e.g., hydrocarbon resin, rosin ester (e.g., glycerol rosin ester, pentaerythritol rosin ester, and hydrogenated versions thereof), aromatic resins including, e.g., aromatic modified hydrocarbon resins, alphamethyl styrene resin, styrene, polystyrene, coumorone, indene, and vinyl toluene, and styrenated terpene resin, polyphenols, polyterpenes, and combinations thereof.

Useful plasticizers include, e.g., liquid aromatic ester plasticizers including dioctyl phthalate esters, solid plasticizers including dicyclohexyl phthalate and cyclohexane dimenthanol dibenzoate, and combinations thereof.

Useful waxes include, e.g., hydroxy modified waxes, carbon monoxide modified waxes, hydroxy stearamide waxes, fatty amide waxes, hydrocarbon waxes including, e.g., high density low molecular weight polyethylene waxes, paraffin waxes and microcrystalline waxes, and combinations thereof.

Examples of useful commercially available antioxidants include IRGANOX 565, 1010 and 1076 hindered phenolic antioxidants available from Ciba-Geigy (Hawthorne, N.Y.), and ANOX 20 hindered phenolic antioxidant from Great Lakes Chemicals (West Lafayette, Ind.). These antioxidants can act as free radical scavengers and can be used alone or in combination with other antioxidants including, e.g., phosphite antioxidants (e.g., IRGAFOS 168 available from Ciba-Geigy). Other antioxidants include CYANOX LTDP thioether antioxidant available from Cytec Industries (Stamford, Conn.), and ETHANOX 330 a hindered phenolic antioxidant available from Albemarle (Baton Rouge, La.). When present, the moisture curable polyurethane hot melt adhesive composition preferably includes no greater than about 2% by weight antioxidant based on the total weight of the adhesive composition.

Examples of useful commercially available fillers include MISTRON VAPOR talc from Luzenac America, Inc. (Englewood, Colo.). When present, the moisture curable polyurethane hot melt adhesive composition preferably includes less than about 5% by weight, or even less than about 2% by weight of these ingredients based on the total weight of the adhesive composition.

Use

The moisture curable adhesive composition can be applied using any suitable application method including, e.g., automatic fine line dispensing, slot die coating, roll coating, gravure coating, transfer coating, pattern coating, screen printing, spray coating, filament coating, by extrusion, air knife, trailing blade, brushing, dipping, doctor blade, offset gravure coating, rotogravure coating, and combinations thereof. The moisture curable adhesive composition can be applied as a continuous or discontinuous coating, in a single or multiple layers, and combinations thereof.

The moisture curable polyurethane adhesive composition can be applied at any suitable temperature including, e.g., from about 40° C. to about 200° C., from about 60° C. to about 175° C., or even from about 90° C. to about 120° C.

Optionally, the surface of the substrate on which the moisture curable adhesive composition is applied is surface treated to enhance adhesion using any suitable method for enhancing adhesion to the substrate surface including, e.g., corona treatments, chemical treatments, flame treatments, and combinations thereof.

The moisture curable adhesive composition can be cured after application using a variety of mechanisms. The curing reaction occurs between a compound having an available active hydrogen atom and the NCO groups of the polyurethane prepolymer. A variety of reactive compounds having free active hydrogen(s) are known in the art including water, hydrogen sulfide, polyols, ammonia and other active compounds. These curing reactions may be carried out by relying on ambient moisture, or the active compounds may be added to the composition at the bond line.

The invention will now be described by way of the following examples. All parts, ratios, percentages and amounts stated in the Examples are by weight unless otherwise specified.

EXAMPLES

Test Procedures

Test procedures used in the examples include the following. All ratios and percentages are by weight unless otherwise indicated. The procedures are conducted at room temperature (i.e., an ambient temperature of from about 20° C. to about 25° C.) unless otherwise specified.

Viscosity Test Method

Viscosity is determined at 120° C. using a Brookfield Thermosel viscometer and a spindle number 27.

Melt Transition (Tm) Test Method

The presence of a melt transition is determined using Differential Scanning Calorimetry according to the following process. The sample is equilibrated to 25° C., heated to 120° C. at a rate of 200° C./min, held at 120° C. for ten minutes, cooled from 120° C. to −40° C. at a rate of 5° C./min, held at −40° C. for ten minutes and then heated from −40° C. to 120° C. at 5° C./min. The presence of an endothermic peak during the second heating step, i.e., during the heating from −40° C. to 120° C., reflects the presence of a melt transition.

Stress at Break at 25° C. Test Method

Sample Preparation

To determine the stress at break of an adhesive composition at 25° C., samples are prepared by heating the adhesive composition to a temperature of 120° C. and applying the adhesive composition to one surface of a first polycarbonate test coupon (4 inch (in) by 1 in×⅛ in in dimension) in amount sufficient to produce a bond area of 1 in by ½ in with minimum adhesive squeeze-out. The adhesive composition is then contacted with a second polycarbonate test coupon (4 in by 1 in×⅛ in in dimension), and then a 7 kilogram weight is applied to the entire construction for a period of 10 seconds. Then the weight is removed and the resulting samples are placed in a temperature and humidity controlled room at 25° C. and 50% relative humidity for seven days to cure the adhesive composition.

Sample Testing

The stress at break of the samples is measured at 25° C. according to ASTM D3163 entitled, "Standard Test Method for Determining Strength of Adhesively Bonded Rigid Plastic Lap-Shear Joints in Shear by Tension Loading," using a INSTRON mechanical testing machine at a crosshead speed of a 2 in/minute (min). Five samples are tested and the average value is reported in units of MPa.

Stress at Break at 80° C. Test Method

Sample Preparation

To determine the stress at break of an adhesive composition at 80° C., samples are prepared as described Stress at Break at 25° C. Test Method. The samples are then placed in an 80° C. temperature controlled chamber that encloses the testing grip of an INSTRON mechanical testing machine. The samples are heated at 80° C. for a period of 30 minutes.

Sample Testing

The stress at break of the samples is then measured according to ASTM D3163 while the samples remain in the enclosed at 80° C. chamber. Five samples are tested and the average value is reported in units of MPa.

Adhesive Peelability Test Method

This test is performed in conjunction with the Stress at Break at 80° C. test. Immediately after the Stress at Break of a sample has been determined on a sample tested according to the Stress at Break at 80° C. test method, the sample is removed from the chamber. Within one minute after removing the sample from the chamber, any residual adhesive composition that is present on the substrate is peeled, by hand, from the substrate to which it is adhered. The adhesive peelability is then graded according to the Adhesive Peelability Grading Scale set forth below. The grading ranges from 1 to 5 with 5 being easy to peel off a substrate surface and 1 being very difficult to peel off a substrate surface. Five samples are tested and the average value is reported as peelability followed by grade number.

Adhesive Peelability Grading Scale

| Grade | Category | Description |
| --- | --- | --- |
| 5 | Excellent Peelability | All of the adhesive residue is easily peeled off the substrate surface and the adhesive residue comes off cleanly in one piece. |
| 4 | Relatively Easy To Peel | All of the adhesive residue can be peeled off the substrate surface and the adhesive residue comes off in no greater than five pieces. |
| 3 | Moderately Difficult To Peel | All of the adhesive residue can be peeled off the substrate surface but the adhesive residue comes off in greater than 5 pieces. |

-continued

| Grade | Category | Description |
|---|---|---|
| 2 | Difficult To Peel | Less than 100% of the adhesive residue is removable from the substrate surface, but greater than 50% of the adhesive residue can be removed from the substrate surface. |
| 1 | Very Difficult To Peel | Less than 50% of the adhesive residue is removable from the substrate surface. |

Reliability Test Method

A sample is prepared and cured according to the Stress at Break at 25° C. test method. The sample is then conditioned in a temperature and humidity controlled chamber at 85° C. and 85% relative humidity for seventy-two hours, after which the sample is removed from the chamber, and equilibrated at 25° C. and 50% relative humidity for a day in a controlled environment. The sample is then tested according to the sample testing method of the Stress at Break at 25° C. test method. Five samples are tested and the average value is recorded as Reliability Stress at Break in units of MPa.

Percent Strength Retention Calculation

The percent strength retention is determined by measuring the Stress at Break at 25° C. ($S_i$), measuring the Reliability Stress at Break ($S_2$), dividing the resulting value by the Stress at Break at 25° C. (Si), and then multiplying by 100, which is represented by the following formula:

% Strength Retention=$[S_2/S_i]$*100.

The calculation is determined for five samples and the average value is reported.

Examples 1-10 and Controls 1-3

Examples 1-10 and Controls 1-3 were prepared as follows: polyether polyols and polyester polyols of the type and in the amount set forth in Table 1 were loaded into a glass reactor along with the MODAFLOW flow agent (Monsanto Chemical Company Corporation, St. Louis, Mo.). The mixture was dried under vacuum at 120° C. for 90 minutes. Then, diphenylmethane 4,4'-diisocyanate was slowly added to the mixture under a nitrogen blanket with vigorous stirring. After the isocyanate addition, the reaction was allowed to proceed at 120° C. under vacuum for 90 minutes or until a free isocyanate target of 3% was achieved. The catalyst was then added to the mixture under nitrogen blanket. After mixing for 10 minutes under vacuum, the formulation was discharged from the reactor and then stored in tin cans under nitrogen purge.

The constructions prepared according to Examples 1-10 and Controls 1-3 were tested according to the Stress at Break at 25° C., Stress at Break at 80° C., Adhesive Peelability, and Reliability test methods. In addition, the Percent Strength Retention was determined for Examples 1-10 and Controls 1-3. The results are reported in Table 2.

TABLE 1

| | Control 1 | Control 2 | Example 1 | Example 2 | Example 3 | Example 4 | Example 5 |
|---|---|---|---|---|---|---|---|
| 1000 MW polypropylene glycol | 22.6 | 22.7 | 23.2 | 23.25 | 23.5 | 23.14 | 23.06 |
| 2000 MW neopentylglycol adipate | 22.6 | 22.7 | 23.2 | 23.25 | 23.5 | 23.14 | 23.06 |
| 2000 MW hexanediol adipate | 33.14 | | 0 | 0 | 0 | 0 | 0 |
| 3000 MW hexanediol adipate | 0 | 34.2 | 0 | 0 | 0 | 0 | 0 |
| 3500 MW hexanediol adipate | 0 | 0 | 0 | 0 | 0 | 0 | 0 |
| 5500 MW hexanediol adipate | 0 | 0 | 34.26 | 0 | 0 | 0 | 0 |
| 9000 MW hexanediol adipate | 0 | 0 | 0 | 34.82 | 0 | 25.99 | 17.28 |
| 11000 MW hexanediol adipate | 0 | 0 | 0 | 0 | 34.34 | 0 | 0 |
| 4000 MW polycaprolactone | 0 | 0 | 0 | 0 | 0 | 8.66 | 17.28 |
| 4,4' MDI[1] | 21.4 | 20.14 | 19.08 | 18.42 | 18.4 | 18.81 | 19.06 |
| DMDEE[2] | 0.25 | 0.25 | 0.25 | 0.25 | 0.25 | 0.25 | 0.25 |
| MODAFLOW | 0.01 | 0.01 | 0.01 | 0.01 | 0.01 | 0.01 | 0.01 |

| | Example 6 | Control 3 | Example 7 | Example 8 | Example 9 | Example 10 |
|---|---|---|---|---|---|---|
| 1000 MW polypropylene glycol | 22.99 | 22.92 | 27.6 | 27.7 | 27.75 | 27.9 |
| 2000 MW neopentylglycol adipate | 22.99 | 22.92 | 27.6 | 27.7 | 27.75 | 27.9 |
| 2000 MW hexanediol adipate | 0 | 0 | 0 | 0 | 0 | 0 |

TABLE 1-continued

|  | | | | | | |
|---|---|---|---|---|---|---|
| 3000 MW hexanediol adipate | 0 | 0 | 0 | 0 | 0 | 0 |
| 3500 MW hexanediol adipate | 0 | 0 | 6 | 12 | 18.1 | 0 |
| 5500 MW hexanediol adipate | 0 | 0 | 0 | 0 | 0 | 0 |
| 9000 MW hexanediol adipate | 8.61 | 0 | 17.97 | 12 | 6.04 | 24 |
| 11000 MW hexanediol adipate | 0 | 0 | 0 | 0 | 0 | 0 |
| 4000 MW polycaprolactone | 25.83 | 34.34 | 0 | 0 | 0 | 0 |
| 4,4' MDI[1] | 19.32 | 19.56 | 20.57 | 20.34 | 20.1 | 19.94 |
| DMDEE[2] | 0.25 | 0.25 | 0.25 | 0.25 | 0.25 | 0.25 |
| MODAFLOW | 0.01 | 0.01 | 0.01 | 0.01 | 0.01 | 0.01 |

[1] = 4,4' MDI = diphenylmethane 4,4'-diisocyanate
[2] = DMDEE = 4,4'-(oxydi-2,1-ethanediyl)bis-morpholine

TABLE 2

| Properties | Control 1 | Control 2 | Example 1 | Example 2 | Example 3 | Example 4 | Example 5 |
|---|---|---|---|---|---|---|---|
| Stress @ break at 25° C. (MPa) | 4.7 | 5.3 | 4.3 | 5.2 | 5.1 | 9.4 | 6.1 |
| Stress @ break at 80° C. (MPa) | 1.1 | 1.3 | 1 | 0.5 | 0.6 | 0.7 | 0.8 |
| Peelability @ 25° C. | 0 | 0 | 0 | 0 | 0 | 0 | 0 |
| Peelability @ 80° C. | 1 | 2.8 | 3.6 | 5 | 3.6 | 5 | 5 |
| Reliability Stress @ Break (MPa) | 6.1 | 7.3 | 5.5 | 0.7 | 0.7 | 2.7 | 2.7 |
| Strength Retention (%) | 129.8 | 137.7 | 127.9 | 13.5 | 13.7 | 28.7 | 44.3 |

| Properties | Example 6 | Control 3 | Example 7 | Example 8 | Example 9 | Example 10 |
|---|---|---|---|---|---|---|
| Stress @ break at 25° C. (MPa) | 10.4 | 5.1 | 5.1 | 6.1 | 4.9 | 4.9 |
| Stress @ break at 80° C. (MPa) | 0.9 | 1.3 | 0.8 | 0.9 | 0.9 | 0.7 |
| Peelability @ 25° C. | 0 | 0 | 0 | 0 | 0 | 0 |
| Peelability @ 80° C. | 4.8 | 2.6 | 4.6 | 4.8 | 4.4 | 5 |
| Reliability Stress @ Break (MPa) | 3.6 | 7.4 | 1.6 | 2.5 | 3.3 | 1.1 |
| Strength Retention (%) | 34.6 | 145.1 | 31.4 | 41.0 | 67.3 | 22.4 |

Examples 11-13

Examples 11-13 were prepared as follows: polyester polyols of the type and in the amount set forth in Table 2 were loaded into a glass reactor along with the MODAFLOW flow agent. The mixture was dried under vacuum at 120° C. for 90 minutes. Then, diphenylmethane 4,4'-diisocyanate was slowly added to the mixture under a nitrogen blanket with vigorous stirring. After the isocyanate addition, the reaction was allowed to proceed at 120° C. under vacuum for 90 minutes or until a free isocyanate target of 3% was achieved. The catalyst was then added to the mixture under nitrogen blanket. After mixing for 10 minutes under vacuum, the formulation was discharged from the reactor and then stored in tin cans under nitrogen purge.

The constructions prepared according to Examples 11-13 were tested according to the Stress at Break at 25° C., Stress at Break at 80° C., Adhesive Peelability, and Reliability test methods. In addition, the Percent Strength Retention was determined for Examples 11-13. The results are reported in Table 3.

TABLE 3

|  | Example 11 | Example 12 | Example 13 |
|---|---|---|---|
| 2000 MW neopentylglycol adipate | 19.3 | 19.53 | 19.63 |
| 3500 MW hexanediol adipate | 28.38 | 0 | 0 |
| 9000 MW hexanediol adipate | 0 | 28.73 | 43 |
| 4000 MW polycaprolactone | 13.86 | 14.05 | 0 |
| 1020 MW neopentylglycol phthalate | 19.3 | 19.53 | 19.63 |
| 4,4' MDI | 18.9 | 17.9 | 17.48 |
| DMDEE | 0.25 | 0.25 | 0.25 |
| MODAFLOW | 0.01 | 0.01 | 0.01 |
| Properties |  |  |  |
| Stress @ break at 25° C. (MPa) | 4.4 | 3.5 | 3.1 |
| Stress @ break at 80° C. (MPa) | 1.3 | 0.5 | 0.4 |
| Peelability @ 25° C. | 0 | 0 | 0 |
| Peelability @ 80° C. | 4.4 | 5 | 5 |

Other embodiments are in the claims. All documents referred to herein are incorporated herein by reference.

What is claimed is:
1. An electronic device comprising:
   an electronic component;
   a first substrate;
   a second substrate; and a cured moisture curable hot melt adhesive composition derived from a polyurethane prepolymer comprising the reaction product of
- a first crystalline polyester polyol having a melting point greater than 40° C. and a number average molecular weight from at least 5500 g/mol to 20,000 g/mol, and
- a polyisocyanate, the first substrate being bonded to the second substrate through the adhesive composition, the cured adhesive composition
- being cleanly removable from at least one of the first substrate and the second substrate after conditioning the device at a temperature of from at least 60° C. to no greater than 100° C. for a period of 30 minutes, and
- exhibiting a Reliability Stress at Break of at least 3 MPa.

2. The electronic device of claim 1, wherein the polyurethane prepolymer comprises the reaction product of
the first crystalline polyester polyol having a melting point greater than 40° C. and a number average molecular weight of from at least 5500 g/mol to 20,000 g/mol,
a second crystalline polyester polyol having a melting point greater than 40° C., the second crystalline polyester polyol selected from the group consisting of
crystalline polyester polyol having a number average molecular weight less than 5500 g/mol and being derived from diol and polycarboxylic acid, and
polycaprolactone polyol having a number average molecular weight of from 500 g/mol to 50,000 g/mol, and
the polyisocyanate.

3. The electronic device of claim 1, wherein the polyurethane prepolymer comprises the reaction product of
the first crystalline polyester polyol having a melting point greater than 40° C. and a number average molecular weight of from at least 5500 g/mol to 20,000 g/mol,
a second crystalline polyester polyol having a melting point greater than 40° C., the second crystalline polyester polyol selected from the group consisting of
crystalline polyester polyol having a number average molecular weight less than 5500 g/mol and being derived from diol and polycarboxylic acid, and
polycaprolactone polyol having a number average molecular weight of from 500 g/mol to 50,000 g/mol,
polyether polyol,
a third polyester polyol having a melting point no greater than 25° C., and
the polyisocyanate.

4. The electronic device of claim 1, wherein, after conditioning the device at a temperature of from at least 60° C. to no greater than 100° C. for a period of 30 minutes, the first substrate is separable from the second substrate without damaging at least one of the first substrate and the second substrate.

5. The electronic device of claim 1, wherein, after conditioning the device at a temperature of from at least 60° C. to no greater than 100° C. for a period of 30 minutes, the first substrate is separable from the second substrate using a force no greater than 1 MPa.

6. The electronic device of claim 4, wherein after separating the first substrate from the second substrate, any residue of the cured adhesive composition that is present on the second substrate is cleanly removable from the second substrate.

7. The electronic device of claim 4, wherein after separating the first substrate from the second substrate, any residue of the cured adhesive composition that is present on the second substrate is cleanly removable from the second substrate by peeling.

8. The electronic device of claim 4, wherein after separating the first substrate from the second substrate, any residue of the cured adhesive composition that is present on the second substrate is cleanly removable from the second substrate without the use of solvent.

9. The electronic device of claim 1, wherein the second substrate comprises glass, polymer, or a combination thereof.

10. The electronic device of claim 1, wherein the second substrate comprises a touch sensitive display, a touch insensitive display, a glass panel, or a combination thereof.

11. The electronic device of claim 1, wherein the first substrate comprises thermoplastic polymer, thermoset polymer, metal, metal alloy, composite, polymer, or a combination thereof.

12. The electronic device of claim 1, wherein the second substrate is a touch sensitive display.

13. The electronic device of claim 12, wherein the first substrate is a housing of a personal electronic device.

14. The electronic device of claim 1, wherein the electronic device comprises a smartphone, a tablet, a camera, a watch, or a combination thereof.

15. The electronic device of claim 1, wherein the cured adhesive composition exhibits a Stress at Break at 80° C. of no greater than 1 MPa.

16. The electronic device of claim 1, wherein the cured adhesive composition exhibits a Stress at Break at 25° C. of at least 5 MPa and a Stress at Break at 80° C. of no greater than 1 MPa.

17. The electronic device of claim 1, wherein the cured adhesive composition exhibits a peelability of at least 4.

18. The electronic device of claim 11, wherein the cured adhesive composition exhibits a peelability of at least 4.

19. The electronic device of claim 12, wherein, the cured adhesive composition exhibits a peelability of at least 4.

20. The electronic device of claim 1, wherein, after conditioning the device at 85° C. and 85% relative humidity for a period of 72 hours and cooling the device to room temperature, the first substrate remains permanently bonded to the second substrate.

21. The electronic device of claim 1, wherein the cured adhesive composition exhibits a Reliability Stress at Break of at least 4 MPa.

22. The electronic device of claim 1, wherein the cured adhesive composition exhibits a Reliability Stress at Break of at least 5 MPa.

23. The electronic device of claim 1, wherein the cured adhesive composition exhibits strength retention of at least 30%.

24. The electronic device of claim 1, wherein the cured adhesive composition exhibits strength retention of at least 50%.

25. The electronic device of claim 1, wherein the first crystalline polyester polyol has a melting point greater than 40° C. and a number average molecular weight of from 6000 g/mol to no greater than 20,000 g/mol.

26. The electronic device of claim 2, wherein the first crystalline polyester polyol has a number average molecular weight from 6000 g/mol to 15,000 g/mol and the second crystalline polyester polyol has a number average molecular weight of from 1000 g/mol to 5000 g/mol.

27. The electronic device of claim 3, wherein the polyether polyol has a number average molecular weight of from 400 g/mol to 8000 g/mol.

28. The electronic device of claim 3, wherein the third polyester polyol has a number average molecular weight of from 250 g/mol to 6000 g/mol.

29. The electronic device of claim 2, wherein the first crystalline polyester polyol has a number average molecular weight from 6000 g/mol to 12,000 g/mol and the second crystalline polyester polyol has a number average molecular weight from 2000 g/mol to 4500 g/mol.

30. The electronic device of claim 2, wherein the first crystalline polyester polyol comprises the reaction product of diol and polycarboxylic acid and the second crystalline polyester polyol comprises polycaprolactone polyol.

31. The electronic device of claim 30, wherein the first crystalline polyester polyol has a number average molecular weight of from 6000 g/mol to 12,000 g/mol and the polycaprolactone polyol has a number average molecular weight of from 1000 g/mol to 20,000 g/mol.

* * * * *